United States Patent
Wan et al.

(10) Patent No.: US 12,105,416 B2
(45) Date of Patent: Oct. 1, 2024

(54) PHOTOCURABLE COMPOSITION COMPRISING AN ORGANIC IONIC COMPOUND

(71) Applicant: CANON KABUSHIKI KAISHA, Tokyo (JP)

(72) Inventors: Fen Wan, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 283 days.

(21) Appl. No.: 17/160,936

(22) Filed: Jan. 28, 2021

(65) Prior Publication Data

US 2022/0236640 A1     Jul. 28, 2022

(51) Int. Cl.
| | | |
|---|---|---|
| *G03F 7/00* | (2006.01) | |
| *B05D 3/06* | (2006.01) | |
| *C08F 2/50* | (2006.01) | |
| *C08F 220/18* | (2006.01) | |
| *C08K 5/02* | (2006.01) | |
| *C08K 5/3445* | (2006.01) | |
| *G03F 7/028* | (2006.01) | |

(52) U.S. Cl.
CPC .......... *G03F 7/0002* (2013.01); *B05D 3/067* (2013.01); *C08F 2/50* (2013.01); *C08F 220/1807* (2020.02); *C08F 220/1811* (2020.02); *C08K 5/02* (2013.01); *C08K 5/3445* (2013.01); *G03F 7/028* (2013.01)

(58) Field of Classification Search
CPC ...... G03F 7/0002; G03F 7/0045; G03F 7/028; C08K 5/3445
See application file for complete search history.

(56) References Cited

U.S. PATENT DOCUMENTS

| | | | |
|---|---|---|---|
| 5,523,383 A | 6/1996 | Ikeda | |
| 6,656,660 B1 | 12/2003 | Urano | |
| 7,122,297 B2 | 10/2006 | Maehara | |
| 7,307,118 B2 | 12/2007 | Xu | |
| 7,465,758 B2 | 12/2008 | Falsafi | |
| 9,864,274 B2 | 1/2018 | Rundlett | |
| 10,208,183 B2 | 2/2019 | Kitagawa | |
| 2004/0134604 A1 | 7/2004 | Oxman | |
| 2006/0154173 A1 | 7/2006 | Ishigaki | |
| 2011/0008577 A1* | 1/2011 | Miyake | G03H 1/028 264/494 |
| 2013/0004768 A1 | 1/2013 | Yamagata | |
| 2014/0030519 A1* | 1/2014 | Morimoto | C09J 7/385 428/356 |
| 2014/0045966 A1* | 2/2014 | Motofuji | C08G 18/6705 522/183 |
| 2016/0160003 A1* | 6/2016 | Kitagawa | G03F 7/027 522/182 |
| 2017/0095999 A1 | 4/2017 | Kaneiwa | |
| 2017/0120572 A1 | 5/2017 | Khusnatdinov | |
| 2018/0118988 A1* | 5/2018 | Kuroda | C09J 11/06 |
| 2018/0120698 A1* | 5/2018 | Kitagawa | H01L 23/31 |
| 2020/0013945 A1* | 1/2020 | Guhathakurta | C08K 5/3445 |
| 2020/0339828 A1 | 10/2020 | Li | |

FOREIGN PATENT DOCUMENTS

| | | | | |
|---|---|---|---|---|
| CN | 105492468 A | | 4/2016 | |
| TW | 201137080 A | | 11/2011 | |
| TW | 201544831 A | | 12/2015 | |
| WO | WO-2015174399 A1 | * | 11/2015 | ............. B29C 59/02 |

OTHER PUBLICATIONS

English translation of WO2015174399. (Year: 2015).*
Zhong et al., "Highly Conductive, Photolithographically Patternable Ionogels for Flexible and Stretchable Electrochemical Devices", Jun. 1, 2018, ACS Applied Materials & Interfaces, 10, 21601-21611. (Year: 2018).*
Bakhtina et al., "Two-Photon Nanolithography Enhances the Performances of an Ionic Liquid-Polymer Composite Sensor", 2015, Advanced Functional Materials, 25, 1683-1693. (Year: 2015).*
Sood et al., "1,2,3-Triazolium-based poly(acrylate ionic liquid)s", Elsevier, Polymer 55 (2014) 3314-3319.
Sood et al., "Triethylene glycol-based poly(1,2,3-triazolium acrylate)s with enhanced ionic conductivity", Polym. Chem., 2015, 6, 3521-3528.
Mayer, "The underestimated impact of instabilities with nanoimprint", Appl. Phys. A (2015) 121:405-414 DOI 10.1007/s00339-015-9300-3.
Lee, "Ion Conduction in Imidazolium Acrylate Ionic Liquids and their Polymers", Chem. Mater. 2010, 22, 5814-5822 DOI:10.1021/cm101407d.
Grothe, "Acrylate Functionalized Tetraalkylammonium Salts with Ionic Liquid Properties", kMolecules 2012, 17, 6593-6604; doi:10.3390/molecules17066593.

* cited by examiner

*Primary Examiner* — Chanceity N Robinson
*Assistant Examiner* — Anna Malloy
(74) *Attorney, Agent, or Firm* — Abel Schillinger, LLP

(57) ABSTRACT

A photocurable composition can comprise a polymerizable material, an organic ionic compound and a photoinitiator, wherein an amount of the organic ionic compound may be not greater than 1.5 wt %, the organic ionic compound comprises an organic cation, and a conductivity of the photocurable composition can be at least 20 μS/cm. The photocurable composition can have an improved drop spreading and merging of drops in comparison to the same composition but not including the organic ionic compound.

15 Claims, No Drawings

PHOTOCURABLE COMPOSITION COMPRISING AN ORGANIC IONIC COMPOUND

FIELD OF THE DISCLOSURE

The present disclosure relates to a photocurable composition, particularly to a photocurable composition including an organic ionic compound to increase the conductivity of the photocurable composition.

BACKGROUND

Inkjet Adaptive Planarization (IAP) uses flowable liquids (resists) to fill trenches, gaps, or other topography variations on a substrate and then are contacted by and cured under a superstrate to form a planar layer. In Nanoimprint Lithography (NIL), a template is filled with a liquid resist and after curing and further processing, the pattern of the template is transferred to the underlying substrate. During IAP and NIL processing high electrostatic forces can develop, which may repulse the drops from each other and thereby interfering with the drop spreading and the speed of filling trenches or a template.

There exists a need to counterbalance the electrostatic forces developed during IAP and NIL processing to improve drop spreading, processing efficiency and the quality of the photo-cured layers.

SUMMARY

In one embodiment, a photocurable composition can comprise a polymerizable material, an organic ionic compound and a photoinitiator, wherein an amount of the organic ionic compound may be not greater than 1.5 wt %; the organic ionic compound can comprise an organic cation; and a conductivity of the photocurable composition may be at least 20 µS/cm.

In one aspect of the photocurable composition, the amount of the organic ionic compound can be at least 0.05 wt % and not greater than 1.2 wt % based on the total weight of the photocurable composition.

In a further aspect of the photocurable composition, the organic cation can comprise an aromatic ring or a heteroaromatic ring. In a certain particular aspect, the organic cation can comprise an imidazole ring.

In another aspect of the photocurable composition, the organic cation can comprise a functional group which can participate in a polymerization reaction of the polymerizable material. In a particular aspect, the functional group of the organic cation can be a vinyl group.

In yet a further aspect, the organic cation of the organic ionic compound can comprise not more than 20 carbon atoms. In a particular aspect, the organic cation may comprise not more than 10 carbon atoms.

In a certain particular aspect, the organic ionic compound of the photocurable composition can include diphenyliodonium hexafluorophosphate (DPHF), 1-ethyl-3-methylimidazolium dicyanamide (EMID), 1-allyl-3-methylimidazolium dicyanamide (AMID), or any combination thereof.

In another aspect, the conductivity of the photocurable composition can be at least 50 µS/cm.

In a further aspect, the photocurable composition can be free of a solvent.

In one aspect of the photocurable composition, an amount of the polymerizable material can be at least 90 wt % based on the total weight of the photocurable composition.

In a certain aspect, the polymerizable material of the photocurable composition can comprise at least one monofunctional acrylate monomer and at least one multi-functional acrylate monomer.

In one embodiment, a viscosity of the photocurable composition can be not greater than 25 mPa·s.

In another embodiment, a laminate can comprise a substrate and a photo-cured layer overlying the substrate, wherein the photo-cured layer may be formed from the above-described photocurable composition.

In one embodiment, a method of forming a photo-cured layer on a substrate can comprise: applying a layer of a photocurable composition on the substrate, the photocurable composition comprising a polymerizable material, an organic ionic compound, and a photoinitiator, wherein an amount of the organic ionic compound can be not greater than 1.5 wt % based on the total weight of the photocurable composition; the organic ionic compound can comprise an organic cation, and a conductivity of the photocurable composition may be at least 20 µS/cm; bringing the photocurable composition into contact with an imprint template or a superstrate; irradiating the photocurable composition with light to form a photo-cured layer; and removing the imprint template or the superstrate from the photo-cured layer.

In one aspect of the method, the conductivity of the photocurable composition can be at least 50 µS/cm.

In another aspect of the method, the organic cation of the organic ionic compound can comprise an aromatic ring or a heteroaromatic ring.

In another embodiment, a method of manufacturing an article can comprise: applying a layer of a photocurable composition on a substrate, wherein the photocurable composition comprises a polymerizable material, and organic ionic compound, and a photoinitiator, and wherein an amount of the organic ionic compound can be not greater than 1.5 wt % based on the total weight of the photocurable composition, an organic ionic compound comprises an organic cation, and a conductivity of the photocurable composition may be at least 20 µS/cm; bringing the photocurable composition into contact with an imprint template or a superstrate; irradiating the photocurable composition with light to form a photo-cured layer; removing the imprint template or the superstrate from the photo-cured layer; forming a pattern on the substrate; processing the substrate on which the pattern has been formed in the forming; and manufacturing an article from the substrate processed in the processing.

In one aspect of the method of manufacturing an article, the viscosity of the photocurable composition can be not greater than 25 mPa·s.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a photocurable composition comprising a polymerizable material, an organic ionic compound and a photoinitiator, wherein the amount of the organic ion compound can be not greater than 1.5 wt %. The organic ionic compound can comprise an organic cation, and a conductivity of the photocurable composition may be at least 20 µS/cm. It has been surprisingly observed that the presence of an organic ionic compound may improve properties of the photocurable composition which are favorable for NIL and AIP processing. Not being bound to theory, it is assumed that with an increased conductivity the generation of electrostatic forces may be reduced, allowing an improved drop spreading and merging behavior of the drops and causing a faster template filling.

As used herein, the term organic ionic compound relates to a compound comprising an organic cation and a negatively charged counter ion as anion. The organic ionic compound can be dissolved in the photocurable composition, wherein the dissociation of the organic ionic compound is leading to organic cations, i.e., positively charged organic ions, and negatively charged counter ions (anions). In aspects, the negatively charged ions can be inorganic anions or organic anions.

As used herein, the term "organic" relates to a compound which includes covalent bonds formed between carbon atoms and hydrogen atoms.

In one aspect, the organic cation of the organic ionic compound can comprise an aromatic ring or a heteroaromatic ring. In a certain aspect, the heteroaromatic ring can include nitrogen and/or oxygen. In a particular certain aspect, the heteroaromatic ring can be an imidazole ring.

Non-limiting examples of organic ionic compounds including an imidazole ring can be, for example, 1-ethyl-3-methylimidazolium dicyanamide (EMID) or 1-allyl-3-methylimidazolium dicyanamide (AMID), see structures 1 and 2:

EMID:

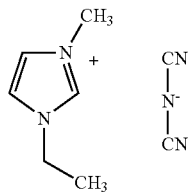

(1)

AMID:

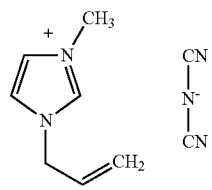

(2)

In another aspect, the organic cation can comprise at least one functional group which can participate in the polymerization reaction of the polymerizable material. The functional group can be, for example, a vinyl group, an acrylate group, a methacrylate group, a hydroxyl group, an amine group, a cyano group, or a maleimide group. In a particular aspect, the functional group can be a vinyl group, see for example, AMID of structure (2).

A non-limiting example of an organic ionic compound including a cation containing an aromatic ring can be diphenyliodonium hexafluorophosphate (DPHF), see structure 3:

DPHF:

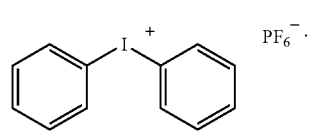

(3)

In one aspect, the organic cation of the organic ionic compound can comprise not more than 20 carbon atoms, such as not more than 15 carbon atoms, not more than 12 carbon atoms, not more than 10 carbon atoms, not more than 8 carbon atoms, or not more than 6 carbon atoms. In another aspect, the organic cation may comprise at least 3 carbon atoms, such as at least 5 carbon atoms, or at least 7 carbon atoms.

The organic ionic compound can be a compound being fluid or solid at room temperature.

As further shown in the examples of the specification, the presence of an organic ionic compound in the photocurable composition can increase to a large extent the conductivity of the photocurable composition. In one aspect, the conductivity of the photocurable composition can be at least 5 µS/cm, such as at least 10 µS/cm, at least 20 µS/cm, at least 50 µS/cm, at least 80 µS/cm, at least 100 µS/cm, at least 150 µS/cm, at least 200 µS/cm, at least 300 µS/cm, at least 400 µS/cm, at least 500 µS/cm, or at least 600 µS/cm. In another aspect, the conductivity may be not greater than 2000 µS/cm, or not greater than 1500 µS/cm, or not greater than 1000 µS/cm, of not greater than 800 µS/cm. The conductivity can be a value within a range between any of the minimum and maximum values noted above.

In one embodiment, the amount of the organic ionic compound can be at least 0.01 wt % based on the total weight of the photocurable composition, such as at least 0.05 wt %, at least 0.1 wt %, at least 0.2 wt %, at least 0.4 wt %, at least 0.6 wt %, at least 0.8 wt %, or at least 1.0 wt %. In another aspect, the amount of the organic ionic compound may be not greater than 2 wt %, or not greater than 1.5 wt %, or not greater than 1.2 wt %, or not greater than 1.0 wt %, or not greater than 0.7 wt %. The amount of the organic ionic compound can be within a range between any of the minimum and maximum numbers noted above.

The polymerizable material of the photocurable composition of the present disclosure can include a combination of at least two polymerizable monomers, oligomers, polymers, or any combination thereof. In one aspect, the polymerizable material can comprise at least one mono-functional acrylate monomer and at least one multi-functional acrylate monomer. As used herein, the term acrylate monomer relates to unsubstituted or alkyl-substituted acrylate monomers, for example methacrylate monomers.

The amount of polymerizable material in the photocurable composition can be at least 75 wt % based on the total weight of the photocurable composition, such as at least 80 wt %, at least 85 wt %, at least 90 wt %, or at least 95 wt %. In another aspect, the amount of polymerizable material may be not greater than 99 wt %, such as not greater than 98 wt %, or not greater than 97 wt %, or not greater than 95 wt % based on the total weight of the photocurable composition. The amount of polymerizable material can be a value between any of the minimum and maximum values noted above. In a particular aspect, the amount of the polymerizable material can be at least 85 wt % and not greater than 98 wt %.

Important for the selection of monomers is the aspect of maintaining a low viscosity of the polymerizable composition before curing. In one embodiment, the viscosity of the curable composition can be not greater than 30 mPa·s, such as not greater than 25 mPa·s, not greater than 20 mPa·s, not greater than 15 mPa·s, or not greater than 10 mPa·s. In other certain embodiments, the viscosity may be at least 1 mPa·s, such as at least 3 mPa·s, such as at least 5 mPa·s, or at least 8 mPa·s. In a particularly preferred aspect, the photocurable composition can have a viscosity of not greater than 25 mPa·s. As used herein, all viscosity values relate to viscosities measured at a temperature of 23° C. with the Brookfield method using a Brookfield Viscometer.

In another aspect, a contact angle of the photocurable composition to a resist primed quartz surface after 3 seconds can be not greater than 20 degrees, such as not greater than 18 degrees, not greater than 16 degrees, not greater than 14, degrees, or not greater than 12 degrees.

In yet a further aspect, after photo-curing the photocurable composition, the glass transition temperature of the photo-cured layers can be at least 95° C., or at least 96° C., or at least 98° C.

In a further aspect, the photocurable composition of the present disclosure may be free of a solvent.

In order to initiate the photo-curing of the composition if exposed to light, one or more photoinitiators can be included in the photocurable composition. In one aspect, the amount of one or more photoinitiators can be between 1 wt % and 4 wt % based on the total weight of the photocurable composition.

In a certain aspect, the curing can be also conducted by a combination of light and heat curing.

The photocurable composition can further contain one or more optional additives. Non-limiting examples of optional additives can be stabilizers, dispersants, solvents, surfactants, inhibitors or any combination thereof. In a certain aspect, the amount of one or more surfactants can be between 0.3 wt % and 5 wt % based on the total weight of the photocurable composition.

In one embodiment, the photocurable composition can be applied on a substrate to form a photo-cured layer. As used herein, the combination of substrate and photo-cured layer overlying the substrate is called a laminate.

The present disclosure is further directed to a method of forming a photo-cured layer. The method can comprise applying a layer of the photocurable composition described above over a substrate, bringing the photocurable composition into contact with a template or superstrate; irradiating the photocurable composition with light to form a photo-cured layer; and removing the template or the superstrate from the photo-cured layer.

The substrate and the solidified layer may be subjected to additional processing, for example, an etching process, to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like.

The photo-cured layer may be further used as an interlayer insulating film of a semiconductor device, such as LSI, system LSI, DRAM, SDRAM, RDRAM, or D-RDRAM, or as a resist film used in a semiconductor manufacturing process.

As further demonstrated in the examples, it has been surprisingly observed that the inclusion of an organic ionic compound in a photocurable composition can have several advantages for NIL and AIP processing. It could be shown that adding an organic ionic compound in an amount of not greater than 1.5 wt % can increase the conductivity of the composition, may decrease the contact angle, lower the separation energy and enhance the filling time of a template, while it can keep the viscosity of the composition, the hardness and strength of the formed photo-cured layers at the same level as for a comparative resist composition which does not include an organic ionic compound.

EXAMPLES

The following non-limiting examples illustrate the concepts as described herein.

Example 1

Preparing of Photocurable Compositions

Photocurable compositions were prepared including the following organic ionic compounds:
1) Diphenyliodonium hexafluorophosphate (DPHF);
2) 1-ethyl-3-methylimidazolium dicyanamide (EMID); and
3) 1-allyl-3-methylimidazolium dicyanamide (AMID).

Each ionic compound was added in varying amounts to a base composition. The base composition (hereinafter comparative sample C1) contained the following ingredients: 50 parts benzyl acrylate (BA), 30 parts 1-naphthyl acrylate (1-NA), 20 parts biphenyl A dimethacrylate (BPADMA), 3 parts photoinitiator (Irgacure 819), and 1 part surfactants (0.5 parts of FS2000M2 and 0.5 parts of Chemguard S554) as release agents. The viscosity of the base composition was 8.7 cP at 23° C.

A summary of the prepared combinations of base composition with the ionic compounds is shown in Table 1. Four different concentrations based on total weight of the compositions were investigated for each organic ionic compound: A: 0 wt %, B: 1 wt %, C: 0.5 wt %, and D: 0.2 wt %.

TABLE 1

| Sample | Ionic compound | Amount of ionic compound [wt %] | | | |
|---|---|---|---|---|---|
| | | A | B | C | D |
| S1 | DPHF | 0 | 1 | 0.5 | 0.2 |
| S2 | EMID | 0 | 1 | 0.5 | 0.2 |
| S3 | AMID | 0 | 1 | 0.5 | 0.2 |

Example 2

Several properties of the photocurable compositions S1, S2, and S3 and photo-cured layers made from the photocurable compositions were measured and compared with comparative sample C1 (base composition, corresponding to A in tables 1, 2, and 3), such as conductivity, viscosity, surface tension, contact angle, glass transition temperature, hardness, storage modulus, separation energy, drop spreading, and local filling behavior.

Viscosity and Conductivity

Table 2 shows a summary of the measured viscosities. It can be seen that the viscosities only had a very minor increase by adding the ionic compound to the base composition (A with 0 wt %). For all samples, regardless of the type and amount of ionic compound, the viscosities were below 10 mPa s.

TABLE 2

| Sample | Ionic compound | Viscosity [mPa s] | | | |
|---|---|---|---|---|---|
| | | A (0 wt %) | B (1 wt %) | C (0.5 wt %) | D (0.2 wt %) |
| S1 | DPHF | 8.7 | 9.1 | 8.9 | 8.74 |
| S2 | EMID | 8.7 | 9.1 | 8.89 | 8.75 |
| S3 | AMID | 8.7 | 9.0 | 8.87 | 8.79 |

The viscosities of the samples were measured at 23° C., using a Brookfield Viscometer LVDV-II+Pro at 200 rpm, with a spindle size #18. For the viscosity testing, about 6-7 mL of sample liquid was added into the sample chamber, enough to cover the spindle head. For all viscosity testing, at least three measurements were conducted and an average value was calculated.

Conductivity

The conductivity of the photocurable compositions was measured with an OAKTON CON 6+ Conductivity Meter. For each measurement, the electrode (ECCONSEN91B) was immersed into 20 ml test solution having a temperature of 23° C. for 20 seconds, while the solution was gently stirred. Thereafter, the solution with the immersed electrode was covered with a parafilm to avoid evaporation and after 10 minutes the value for the conductivity was read. The test was repeated three times and the average value calculated.

Table 3 shows a summary of the tested samples and the obtained conductivities. It can be seen that adding 1 wt % of ionic compound to the base composition increased the conductivity of the resist composition by the factor of at least 300 or greater. Specifically, adding 1 wt % of DPHF to the base resist composition increased the conductivity from 0.5 µS/cm to 165 µS/cm (which corresponds to an increase by the factor of 330). A further and even much greater increase in conductivity could be obtained by the presence of 1 wt % EMID (663 µS/cm) or 1 wt % AMID (547 µS/cm).

TABLE 3

| Sample | Ionic compound | Conductivity [µS/cm] | | | |
|---|---|---|---|---|---|
| | | A (0 wt %) | B 1 (wt %) | C (0.5 wt %) | D (0.2 wt %) |
| S1 | DPHF | 0.5 | 165 | 22 | 13 |
| S2 | EMID | 0.5 | 663 | 48 | 22 |
| S3 | AMID | 0.5 | 547 | 43 | 20 |

Contact Angle and Surface Tension

The contact angle and surface tension were measured with a Drop Master DM-701 contact angle meter made by Kyowa Interface Science Co. Ltd. (Japan). For the testing, a quartz slide was first primed with the test sample to mimic the real imprinting surface.

For conducting the priming of the quartz slide, the quartz slide was first washed with 0.01% Alconox, rinsed with deionized water and dried under nitrogen. Thereafter, the quartz slide was exposed to 15 min UV Ozone treatment. On a silicon wafer containing a 5 nm thick adhesion promoter layer (the silicon wafer functioning as substrate), three drops, each drop having a volume of 3.5 µl of resist composition, were placed in a line 20 mm apart of each other. Thereafter, the cleaned quartz slide was placed on the silicon wafer containing the resist drops, and the drops were allowed to spread completely with no bubbles between quartz slide and silicon wafer. The stack was irradiated with 300 mJ UV light to fully cure the resist. After curing the resist, the quartz slide was removed from the silicon wafer, and the surface of the quartz slide which had touched the resist layer was taken as the resist-primed surface for the contact angle measurements.

Thereafter, 2 ml of the test sample was added to the syringe, of which 2 µl sample per test was added by the machine to the primed quartz surface. Drop images were continuously captured by a CCD camera from the time the resist sample drop touched the primed quartz surface. The contact angle was automatically calculated by the software based on the analysis of the images. The data presented in Table 4 are the contact angles at a time of 3 seconds after touching the primed quartz surface. The DM701 further calculated the surface tension based on images of drops hanging on the syringe needle and using the Young Laplace theory.

It can be seen that the presence of 1 wt % ionic compound clearly decreased the contact angle from 26 degrees (base composition C1 with no ionic compound) to 17 degrees (Sample S1 with 1 wt % DPHF), or to 15 degrees (Sample S2 with 1 wt % AMID), and even down to 10 degrees (Sample S3 with 1 wt % EMID). The contact angle indicates the wettability of the liquid to the template surface during imprinting. A lower contact angle is preferred for good liquid spreading and trench filling, which can enhance the throughput during IAP or NIL processing.

In contrast to the contact angle, the surface tension was not influenced by the addition of the organic ionic compounds to the base composition. As can be seen in Table 4, there was only a minor increase in the surface tension from 31 mN/m to 32 mN/m for all three ionic compounds if 1 wt % was added to the base composition based on the total weight of the photocurable composition.

TABLE 4

| Sample | Ionic compound | Contact Angle [°] | Surface Tension [mN/m] |
|---|---|---|---|
| S1 | 1 wt % DPHF | 17.0 | 32 |
| S2 | 1 wt % EMID | 10.5 | 32 |
| S3 | 1 wt % AMID | 15.0 | 32 |
| C1 | No organic ionic compound | 26.0 | 31 |

Glass Transition Temperature, Storage Modulus and Hardness

The reduced modulus and glass transition temperature were measured with an Anton-Paar MCR-301 rheometer coupled with a Hamamatsu Lightningcure LC8 UV source. The sample was radiated with a UV intensity of 1.0 mW/cm2 at 365 nm controlled by a Hamamatsu 365 nm UV power meter. Software named RheoPlus was used to control the rheometer and to conduct the data analysis. The temperature was controlled by a Julabo F25-ME water unit and set to 23° C. as starting temperature. For each sample testing, 7 µl resist sample was added onto a glass plate positioned directly underneath the measuring system of the rheometer. Before starting with the UV radiation, the distance between glass plate and measuring unit was reduced to a gap of 0.1 mm. The UV radiation exposure was continued until the storage modulus reached a plateau, and the height of the plateau was recorded as the storage modulus listed in Table 5.

After the UV curing was completed, the temperature of the cured sample was increased by controlled heating to measure the change of the storage modulus in dependency to the temperature to obtain the glass transition temperature $T_g$. As glass transition temperature $T_g$ was considered the temperature corresponding to the maximal value of Tangent (θ).

The hardness was calculated from loading curves measured with the Hysitron TI 950 Triboindenter by indent to 200 nm, using the displacement controlled loading function. During indentation, the force was measured, from which the loading curves could be obtained. The hardness (H) was calculated according to the following equation: $H=P_{max}/A_c$, wherein $P_{max}$ is the maximum applied force, and $A_c$ is the contact area determined by the tip area function.

It can be seen from the data summarized in Table 5 that the addition of 1 wt % ionic organic compound increased the glass transition temperature from 93° C. by at least 5° C. to values between 96° C. and 98° C. A higher Tg value is desirable, since it is known that a high Tg can reduce the line waviness during etching and enhance the etch performance of a resist.

In contrast to the glass transition temperature, the hardness, contact depth and reduced modulus measured by nanoindentation were nearly not affected by the presence of the organic ionic compound.

TABLE 5

| Sample | Ionic compound | Glass Transition Temperature [° C.] | Contact Depth [nm] | Reduced Modulus [GPa] | Hardness [GPa] |
|---|---|---|---|---|---|
| S1 | 1 wt % DPHF | 98 | 192.0 | 4.24 | 0.3 |
| S2 | 1 wt % EMID | 96 | 190.9 | 4.25 | 0.3 |
| S3 | 1 wt % AMID | 97 | 190.7 | 4.33 | 0.3 |

TABLE 5-continued

| Sample | Ionic compound | Glass Transition Temperature [° C.] | Contact Depth [nm] | Reduced Modulus [GPa] | Hardness [GPa] |
|---|---|---|---|---|---|
| C1 | No ionic compound | 93 | 193.7 | 4.31 | 0.3 |

Separation Energy

To simulate the separation energy needed to separate a template from the resist after UV exposure, tests were conducted on a CNT J-FIL Imprint Tool 1300 containing a printhead, which allows installing two different resists in parallel at the same time. As substrate was used a 12 inch silicon wafer coated with an adhesion promoter. As template was used a mold having a 26 mm×33 mm patterned area for pattern transfer to a corresponding 26 mm×33 mm location (field) on the wafer.

As resists compositions were compared the base composition (Sample C1) described in Example 1 and Sample S3 containing base composition with 1 wt % AMID.

For the testing, the samples were inkjetted onto the substrate in a grid array patterns of 3.25 pL droplets, with each sample tested across six measuring points (fields). The curing dosage was 2400 mJ/cm2. After curing the resist composition, the template (mold) was pulled up and away from the cured resist. The separation energy is the product of the measured separation force and separation time, wherein the separation time was measured from the beginning of the pulling to the end point when the template is completely separated from the resist.

The obtained results are summarized in Table 6, showing the calculated average of the six measuring points. It can be seen that Sample S3 needed a lower separation energy than the base composition C1, which contained no organic ionic compound. The difference in the required separation energy was about 12%. A lower separation energy can have benefits in reduction of line stretching and thereby reducing the amount of defects caused be the separation step.

TABLE 6

| Sample | Average Separation Energy [mJ] |
|---|---|
| S3 | 1.37 |
| C1 | 1.55 |

Drop Spreading

The drop spreading of sample S3 and comparative base composition C1 was compared using the same tool 1300 as described above for measuring the separation energy, except that no template was used.

For the testing, a set of drops having a drop volume of 3.25 pL was applied on the substrate and the drop spreading was recorded using a PixeLINK PL-B740 high speed microscopic camera. After 80 seconds, the drops were cured by applying UV light with an intensity of 50 mW/cm2 for 20 seconds to mimic the real curing process.

The comparison of the drop diameters after 80 seconds showed that the drop diameter for sample S3 was 44% bigger than the drop diameter of the drops of sample C1.

Local Fill Time

Local filling tests were conducted to evaluate if the presence of an organic ionic compound can increase the filling speed of a void in a template.

The filling tests were also conducted with the tool 1300 used for measuring the separation energy. The tool was combined with a high speed camera PixeLINK PL-B740 with a camera speed of 0.11 s/frame. The template was also the same as used for the measuring the separation energy.

For the testing, the samples were inkjetted with a drop volume of 3.25 pL in a 4×4 grid pattern, which lead to a film thickness of about 45 nm after UV curing.

The filling time of the mold void was counted from when the template first touched the drops (t=0) and the timed needed for complete filling was visually detected from the taken images. For each testing a curve was created showing the percentage of filled volume vs. the fill time. The measurements were conducted on three independent fields for each sample.

A summary of the results can be seen in Table 7.

TABLE 7

| Sample | Field # | Filling time (s) | Average filling time (s) |
|---|---|---|---|
| S3 | 1 | 5.94 | 5.03 |
| (1 wt % AMID | 2 | 5.83 | |
| | 3 | 6.60 | |
| | 4 | 6.27 | |
| C1 | 5 | 5.39 | 6.16 |
| (no organic | 6 | 5.39 | |
| ionic | 7 | 4.29 | |
| compound) | 8 | 5.06 | |

The results summarized in Table 7 show that sample S3, which contained the base compound plus 1 wt % AMID, had a much faster filling speed than base composition C1, which did not include an ionic organic compound. The filling speed of sample S3 was about 20% faster than the filling speed for comparative sample C1. Not being bound to theory, the higher filling speed of sample S3 may be explained by its higher conductivity compared to sample C1.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A laminate comprising a substrate and a photo-cured layer overlying the substrate, wherein the photo-cured layer is formed from a photocurable composition, the photocurable composition comprising a polymerizable material, an organic ionic compound and a photoinitiator, wherein
   an amount of the organic ionic compound is at least 0.05 wt % and not greater than 1.5 wt %;
   the organic ionic compound comprises an organic cation, the organic cation comprising an imidazole ring, or a functional group which can participate in a polymerization reaction of the polymerizable material, or a combination thereof;
   an amount of the polymerizable material is at least 90 wt % based on the total weight of the photocurable composition;
   a conductivity of the photocurable composition is at least 20 µS/cm; and
   a viscosity of the photocurable composition is not greater than 25 mPa·s.

2. The laminate of claim 1, wherein the amount of the organic ionic compound is at least 0.05 wt % and not greater than 1.2 wt %.

3. The laminate of claim 1, wherein the organic cation comprises an imidazole ring.

4. The laminate of claim 1, wherein the organic cation comprises a functional group which can participate in a polymerization reaction of the polymerizable material.

5. The laminate photocurable composition of claim 1, wherein the functional group of the organic cation is a vinyl group.

6. The laminate of claim 1, wherein the organic cation comprises not more than 20 carbon atoms.

7. The laminate of claim 6, wherein the organic cation comprises not more than 10 carbon atoms.

8. The laminate of claim 7, wherein the organic ionic compound includes diphenyliodonium hexafluorophosphate, 1-ethyl-3-methylimidazolium dicyanamide, 1-allyl-3-methylimidazolium dicyanamide, or any combination thereof.

9. The laminate of claim 1, wherein the conductivity of the photocurable composition is at least 50 µS/cm.

10. The laminate of claim 1, wherein the photocurable composition is free of a solvent and the organic ionic compound is dissolved in the polymerizable material.

11. The laminate of claim 1, wherein the polymerizable material comprises at least one mono-functional acrylate monomer and at least one multi-functional acrylate monomer.

12. A method of forming a photo-cured layer on a substrate, comprising:
    applying a layer of a photocurable composition on the substrate, the photocurable composition comprises a polymerizable material, an organic ionic compound, and a photoinitiator, wherein an amount of the organic ionic compound is at least 0.05 wt % and not greater than 1.5 wt % based on the total weight of the photocurable composition, the organic ionic compound comprises an organic cation, the organic cation comprising an imidazole ring, or a functional group which can participate in a polymerization reaction of the polymerizable material, or a combination thereof, a conductivity of the photocurable composition is at least 20 µS/cm, an amount of the polymerizable material is at least 90 wt % based on the total weight of the photocurable composition and a viscosity of the photocurable composition is not greater than 25 mPa·s;
    bringing the photocurable composition into contact with an imprint template or a superstrate;
    irradiating the photocurable composition with light to form a photo-cured layer;
    and
    removing the imprint template or the superstrate from the photo-cured layer.

13. The method of claim 12, wherein the conductivity of the photocurable composition is at least 50 µS/cm.

14. A method of manufacturing an article, comprising:
applying a layer of a photocurable composition on a substrate, wherein the photocurable composition comprises a polymerizable material, and organic ionic compound, and a photoinitiator, wherein an amount of the organic ionic compound is at least 0.05 wt % and not greater than 1.5 wt % based on the total weight of the photocurable composition, the organic ionic compound comprises an organic cation, the organic cation comprising an imidazole ring, or a functional group which can participate in a polymerization reaction of the polymerizable material, or a combination thereof, a conductivity of the photocurable composition is at least 20 μS/cm, an amount of the polymerizable material is at least 90 wt % based on the total weight of the photocurable composition, and a viscosity of the photocurable composition is not greater than 25 mPa·s;
bringing the photocurable composition into contact with an imprint template or a superstrate;
irradiating the photocurable composition with light to form a photo-cured layer;
removing the imprint template or the superstrate from the photo-cured layer;
forming a pattern on the substrate; and
processing the substrate on which the pattern has been formed in the forming.

15. The laminate of claim 1, wherein a glass transition temperature of the photo-cured layer is at least 95° C.

\* \* \* \* \*

UNITED STATES PATENT AND TRADEMARK OFFICE
CERTIFICATE OF CORRECTION

PATENT NO. : 12,105,416 B2
APPLICATION NO. : 17/160936
DATED : October 1, 2024
INVENTOR(S) : Wan et al.

Page 1 of 1

It is certified that error appears in the above-identified patent and that said Letters Patent is hereby corrected as shown below:

In the Claims

Column 12, please correct Claim 5 to read:
"The laminate of claim 1, wherein the functional group of the organic cation is a vinyl group."

Column 12, please correct Claim 8 to read:
"The laminate of claim 6, wherein the organic ionic compound includes diphenyliodonium hexafluorophosphate, 1-ethyl-3-methylimidazolium dicyanamide, 1-allyl-3-methylimidazolium dicyanamide, or any combination thereof."

Signed and Sealed this
Tenth Day of June, 2025

Coke Morgan Stewart
*Acting Director of the United States Patent and Trademark Office*